(12) United States Patent
Wakui

(10) Patent No.: US 6,477,908 B1
(45) Date of Patent: Nov. 12, 2002

(54) PEDESTAL WITH VIBRATION SENSOR, AND EXPOSURE APPARATUS HAVING THE SAME

(75) Inventor: Shinji Wakui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 09/612,554

(22) Filed: Jul. 7, 2000

(30) Foreign Application Priority Data

Jul. 7, 1999 (JP) .......................................... 11-193650

(51) Int. Cl.[7] .............................................. G01D 21/00
(52) U.S. Cl. ...................................................... 73/866.5
(58) Field of Search .......................... 73/651, 661, 662, 73/663, 866.5; 248/550, 559, 562, 636, 638; 188/378, 379, 380, 267; 267/136

(56) References Cited

U.S. PATENT DOCUMENTS

| | | | |
|---|---|---|---|
| 5,058,433 A | * 10/1991 | Wilson et al. ................. 73/661 |
| 5,176,140 A | * 1/1993 | Kami et al. ................... 310/335 |
| 5,504,407 A | 4/1996 | Wakui et al. ............ 318/568.17 |
| 5,511,930 A | 4/1996 | Sato et al. .................... 414/676 |
| 5,568,032 A | 10/1996 | Wakui ........................... 318/632 |
| 5,653,317 A | 8/1997 | Wakui ........................... 188/378 |
| 5,900,707 A | 5/1999 | Wakui ........................... 318/625 |
| 6,021,991 A | * 2/2000 | Mayama et al. ............. 248/550 |
| 6,170,622 B1 | 1/2001 | Wakui et al. ................. 188/378 |

FOREIGN PATENT DOCUMENTS

JP 7-030360 * 1/1995

* cited by examiner

Primary Examiner—Helen Kwok
(74) Attorney, Agent, or Firm—Fitzpatrick, Cella, Harper & Scinto

(57) ABSTRACT

An exposure apparatus includes a major structure, an active anti-vibration system for supporting the major structure, a pedestal on which the major structure is mounted through the active anti-vibration system, and a vibration sensor embedded in or incorporated in the pedestal. This arrangement accomplishes detection of a signal related to ground vibration without being influenced by any local vibration.

8 Claims, 4 Drawing Sheets

PEDESTAL WITH VIBRATION SENSOR, AND EXPOSURE APPARATUS HAVING THE SAME

FIELD OF THE INVENTION AND RELATED ART

This invention relates to a pedestal with an extended function, serving as a base on which a semiconductor exposure apparatus, for example, is to be mounted, and also to an exposure apparatus having such pedestal.

In order to meet further miniaturization of a semiconductor device, more strict requirements have been applied in respect to a vibration environment of a semiconductor exposure apparatus. Particularly, in semiconductor exposure apparatuses called a "scanner" wherein a wafer stage for carrying a semiconductor wafer thereon and a reticle stage for carrying a reticle (original of a circuit pattern) thereon are scanningly moved in opposite directions in synchronism with each other and at a predetermined velocity ratio and wherein the exposure of the semiconductor wafer is performed during such scan motion, if the synchronous scan motion is disturbed by any vibration, the quality of a product IC is directly degraded. Namely, such scanner is very sensitive to vibration of a floor, for example.

Conventionally, however, no specific design or construction has been made in relation to vibration of a floor within a clean room where a semiconductor exposure apparatus is to be placed. Therefore, such floor vibration causes a critical influence to the scanner. In consideration of it, when a semiconductor exposure apparatus is mounted in a clean room, some measures are taken to substantially reinforce the floor. More specifically, a large base called a "pedestal" such as denoted at 2' in FIG. 2 is used, and the entire semiconductor exposure apparatus 1 is placed thereon. In other words, a very large floor covering for mounting the semiconductor exposure apparatus 1 thereon is prepared. The pedestal thus functions as a base.

However, even if a pedestal having a large mass and an appropriate damping function is used to reduce the vibration to be transmitted to the scanner, it is not possible to completely intercept the vibration transmission. This is because the pedestal is to cover the floor area just to be occupied by the scanner. Namely, vibration can be amplified at the interface between the floor and the pedestal, and it can be transmitted from the pedestal to the semiconductor exposure apparatus. Further, as regards such vibration with which the clean room as a whole can be oscillated, use of a pedestal is not effective to reduce the vibration level.

On the other hand, the major structure of a semiconductor exposure apparatus is supported by an anti-vibration unit. As regards the types of such anti-vibration unit, there are two types: a passive type anti-vibration unit using passive springs or viscosity elements, and an active type anti-vibration unit having sensors and actuators, constituting a closed loop system. Recently, to meet strict vibration environment, the latter active type anti-vibration unit is used in many cases. Such active anti-vibration unit has a function for feeding back signals of sensors to an actuator. Also, it can be equipped with a feed-forward function for detecting floor vibration and driving an actuator while making appropriate compensation to the floor vibration. Moreover, it can be equipped with a reaction-force feed-forward function for driving an actuator in the active type anti-vibration unit on the basis of a driving signal of a unit which produces a large drive reaction force in the semiconductor exposure apparatus. The former feed-forward function is called a floor vibration feed-forward or ground vibration feed-forward. In order to attain this feed-forward function, it is necessary to measure vibration of the floor. Practically, to this end, a vibration sensor is provided in a mechanism component of the semiconductor exposure apparatus, which can be considered as being integral with the floor. A specific example is shown in FIG. 3. Denoted in FIG. 3 at 3 are gratings which are disposed on the floor of a clean room. Denoted at 4 is one pillar of a major structure of a semiconductor exposure apparatus. Denoted at 5 is a structural member which is rigidly connected to the pillar 4 of the major structure. Denoted at 6 is a vibration sensor which is mounted on the structural member 5.

It should be noted however that not only floor vibration but also any other vibration are present at the structural member 5 having the vibration sensor mounted thereon. Namely, local vibration may occur at the structural member 5. Alternatively, any local vibration produced at any other portion (not shown) may be transmitted to the structural member 5. The vibration sensor 6 may of course detect such vibration. This means that a noise other than a signal for the ground vibration feed-forward control can be mixed. Therefore, the effectiveness of the ground vibration feed-forward control based on an output signal of a vibration sensor, where floor vibration and any other local vibration of the structural member, for example, are mixed, is lowered and, thus, the anti-vibration effect to the floor vibration is degraded.

As described above, in semiconductor exposure apparatuses called a scanner, since vibration of a floor on which the exposure apparatus is placed directly influences the performance of the apparatus, a base called a pedestal may be used and the whole exposure apparatus may be mounted thereon. However, even use of such pedestal can not completely remove the vibration. On the other hand, semiconductor exposure apparatuses are generally equipped with an active type anti-vibration unit to meet further miniaturization of semiconductor chips. The active type anti-vibration unit can have a ground vibration feed-forward function for reducing transmission, into the exposure apparatus, of vibration of the floor where the semiconductor exposure apparatus is placed. However, such ground vibration feed-forward function is attained on the basis of a signal into which any local vibration other than the floor vibration can be mixed. Therefore, it is difficult to accomplish an effectual antvibration characteristic.

SUMMARY OF THE INVENTION

It is an object of the present invention to accomplish an effectual ground vibration feed-forward function in an active type anti-vibration system.

In accordance with an aspect of the present invention, there is provided a pedestal, comprising: a pedestal structure for serving as a base for mounting a certain mechanism thereon; and a vibration sensor embedded in or incorporated in said pedestal structure.

The vibration sensor may be operable to detect at least one of an acceleration and a velocity.

The vibration sensor may be operable to detect vibration in orthogonal three axial directions.

The pedestal may further comprise an active anti-vibration system provided in the mechanism.

An output of said vibration sensor may be used as a feed-forward signal for a ground vibration feed-forward control through said active anti-vibration system.

In accordance with another aspect of the present invention, there is provided an exposure apparatus, comprising: a major structure; an active anti-vibration system for supporting said major structure; a pedestal on which said major structure is mounted through said active anti-vibration system; and a vibration sensor embedded in or incorporated in said pedestal.

An output of said vibration sensor may be used as a feed-forward signal for a ground vibration feed-forward control through said active anti-vibration system.

The apparatus may further comprise a controller, wherein, when an earthquake is detected by said vibration sensor, said controller controls the operation of said exposure apparatus on the basis of the detection by said vibration sensor.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

In accordance with the present invention, as described above, a pedestal itself is equipped with a function for detecting vibration. Specifically, a vibration sensor may be embedded in the pedestal, or it may be incorporated into the pedestal, to enable measurement of vibration of the pedestal as a whole. First, the structure of a vibration sensor to be embedded in or incorporated in the pedestal, will be explained.

Figure 4:
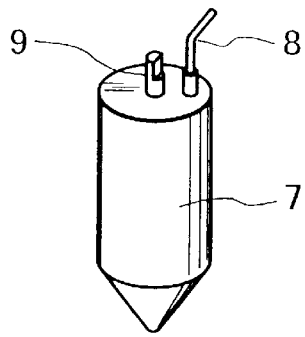
FIG. 4 is an enlarged view of an example of an embedded type vibration sensor.

FIG. 4 shows the structure of an example of an embedded type vibration sensor. Denoted in FIG. 4 at 7 is a three-component vibrograph for detecting vibration in a vertical direction and in two horizontal axial directions. Denoted at 8 is a cable extending from the vibrograph 7, and denoted at 9 is an orientation metal element mounted on the vibrograph 7 and for setting the vibration detecting orientation with respect to a horizontal direction. As regards such vibration sensor having a shape as described above, there is one embedded in a ground for observing earthquakes, and vibration with a velocity and acceleration in three directions (vertical direction and two horizontal axial directions) can be detected with it. As an example, it may have characteristics of a measurement frequency 0.01–100 Hz, a velocity output sensitivity 10 V/kine, an acceleration output 10 mV/gal, a velocity output resolution 100 $\mu$kine, and an acceleration output resolution 100 $\mu$gal. The specification of such vibration sensor is sufficient for an active type anti-vibration unit in a semiconductor exposure apparatus to accomplish the ground vibration feed-forward control.

Figure 1:
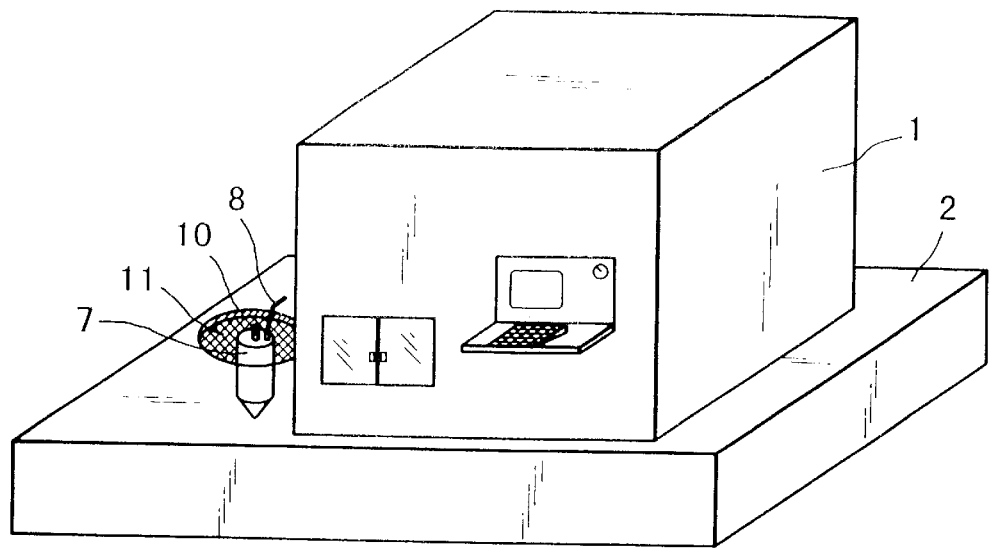
FIG. 1 is a perspective view of a semiconductor exposure apparatus having a pedestal with a vibration sensing function, according to an embodiment of the present invention.
Figure 2:
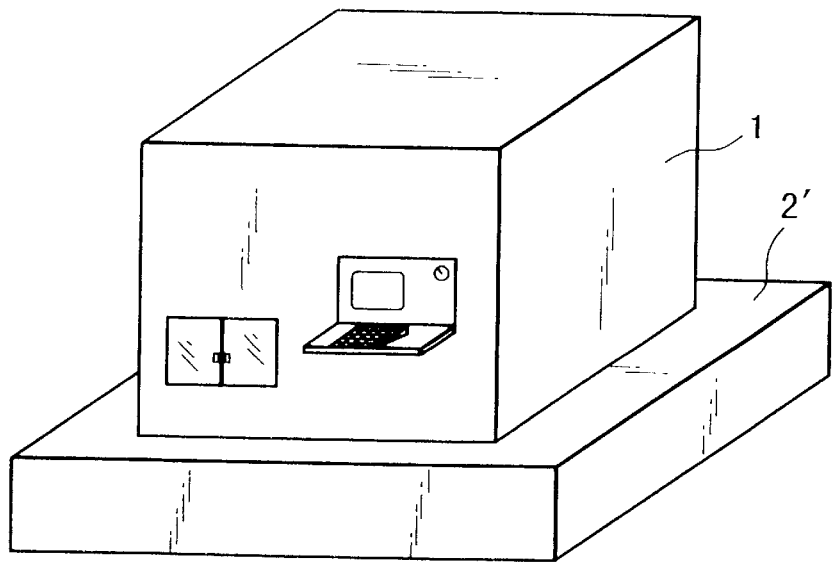
FIG. 2 is a perspective view of a conventional semiconductor exposure apparatus with a pedestal.
Figure 3:
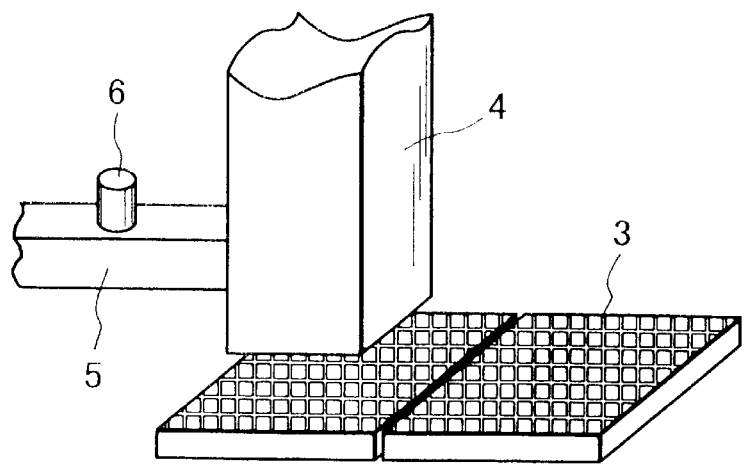
FIG. 3 is a perspective view for explaining use of a vibration sensor for ground vibration feed-forward control, in a conventional example.

FIG. 1 shows a pedestal 2 with a vibration sensing function and having such an embedded vibration sensor, as well as a semiconductor exposure apparatus having the same, according to an embodiment of the present invention. As illustrated in the drawing, the pedestal 2 with a vibration sensing function is equipped with a vibration sensor (FIG. 4) embedded therein. The semiconductor exposure apparatus is mounted on this pedestal 2.

Figure 5:
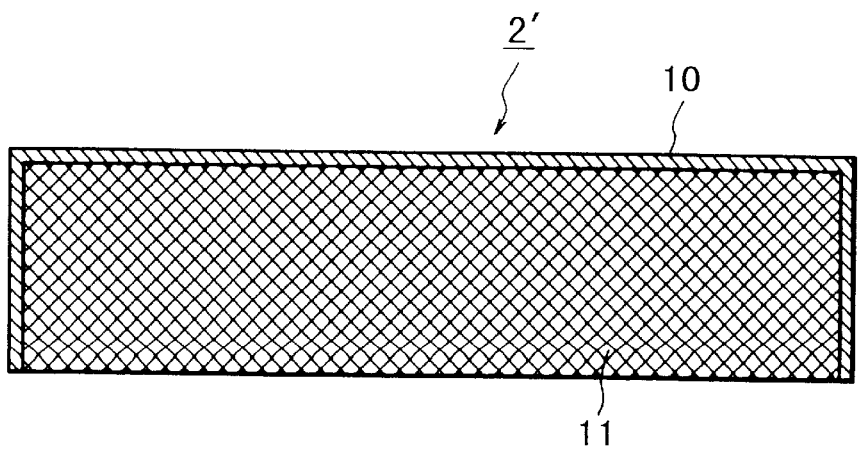
FIG. 5 is a sectional view of a structure of a conventional pedestal.

FIG. 5 shows an example of a conventional pedestal having a sectional structure as illustrated. More specifically, the pedestal comprises a frame 10 of stainless steel, for example, having an appropriate thickness. The inside of the frame 10 being filled with a filling material, whereby a bulk having a huge mass is provided. Here, the filling material 11 should have a rigidity and viscosity, and it should provide a mass effect. A concrete may preferably be used, as an example. Further, although not shown in the drawing, a structural member such as a steel frame may be embedded in the filling material 11, for increasing the strength of the pedestal as a whole. At the surface layer of the bottom face in FIG. 5, there is a material adhered to or painted on it to prevent production of particles therefrom. As described, the pedestal has a very simple structure and, for that reason, local vibration is not easily produced. Therefore, it can be considered as a structural member showing a vibration characteristic as an integral structure.

Figure 6:
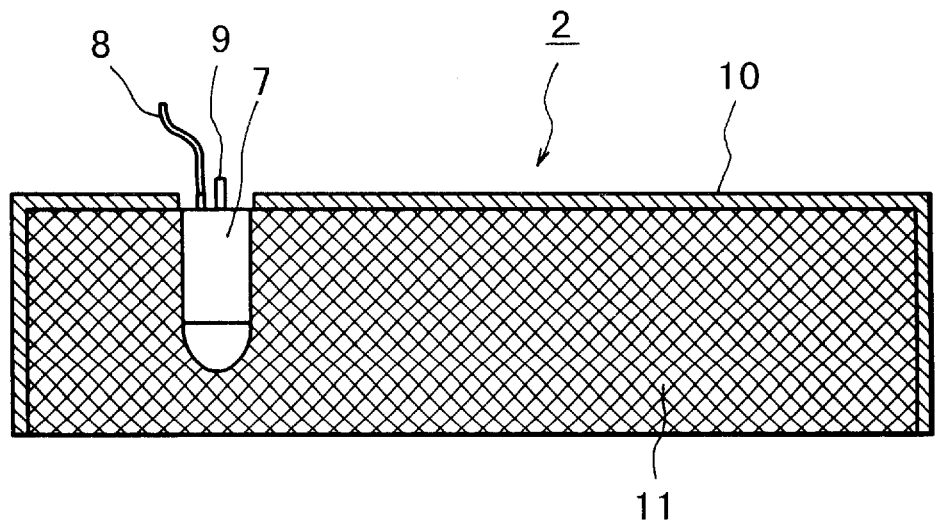
FIG. 6 is a sectional view of a structure of a pedestal with a vibration sensing function, according to an embodiment of the present invention.

On the other hand, the pedestal 2 of the present invention has a vibration sensing function as seen from the sectional structure shown in FIG. 6. As illustrated, a vibration sensor such as shown in FIG. 4 is embedded in a filling material 11. With the provision of such vibration sensor, vibration of the pedestal 2, which can be regarded as integral in terms of vibration, can be detected assuredly and with a good precision. Additionally, since the vibration sensor is embedded inside the pedestal 2, it does not interfere with the mounting of the semiconductor exposure apparatus 1 upon the pedestal 2.

Figure 7:
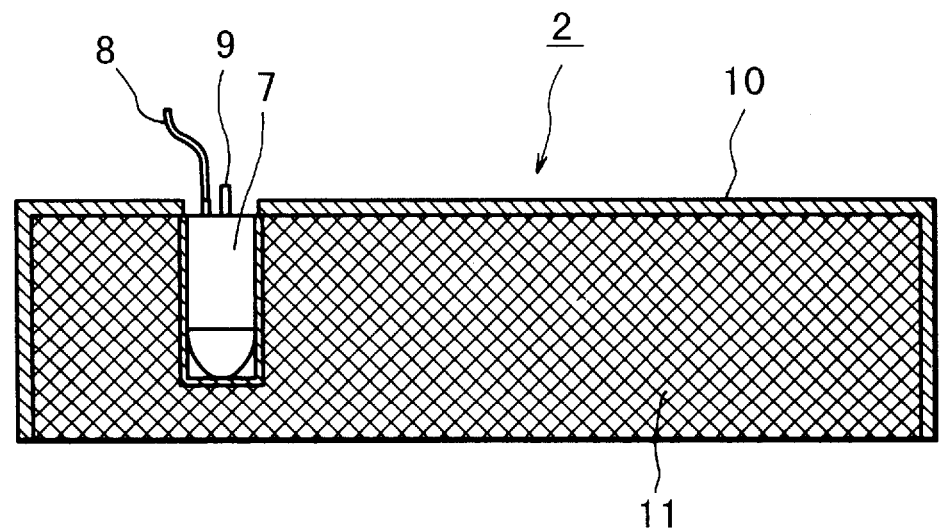
FIG. 7 is a sectional view of a structure of a pedestal with a vibration sensing function, according to another embodiment of the present invention.

FIG. 7 shows another example of a sectional structure of a pedestal with a vibration sensing function, according to the present invention. In the structure of FIG. 6, the three-component vibrograph 7 is embedded in the filling material 11. In other words, the vibrograph 7 cannot be demounted out of the filling material 11. In the example of FIG. 7, on the other hand, there is a space for demountably mounting the three-component vibrograph 7. A hole of an approximately column-like shape, following the shape of the vibrograph 7 is formed in the pedestal 2 beforehand. Then, the vibrograph 7 is put into the hole to be in intimate contact therewith.

In the examples shown in FIGS. 6 and 7, a structural member such as steel frame may be embedded to enlarge the strength of the pedestal 2 as a whole. Also, a material effective to prevent production of dust or particles from the filling material 11 may be adhered to or painted on it.

Figure 8:
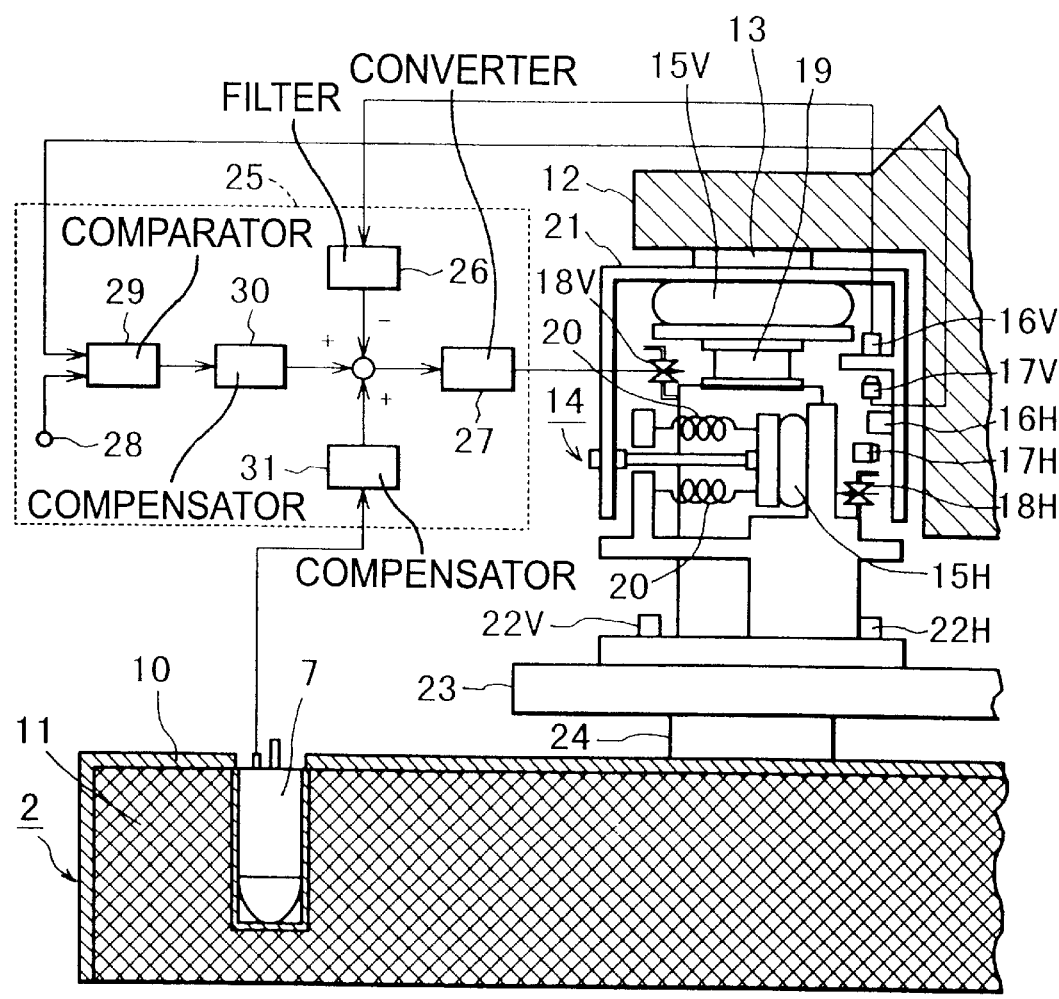
FIG. 8 is a schematic view of a semiconductor exposure apparatus having a pedestal with a ground vibration feed-forward function, according to an embodiment of the present invention.

FIG. 8 shows the system structure for ground vibration feed-forward control in the present invention, to be done on the basis of an output of a vibration sensor embedded or incorporated in the pedestal 2 of FIG. 6 or 7. Denoted in FIG. 8 at 12 is major structure of a semiconductor exposure apparatus having a wafer stage and a projection optical system, for example. Denoted at 13 is a connection plate for connecting a damper supporting leg 14 of an active type anti-vibration unit to the major structure 12. The inside mechanism placed in the damper supporting leg 14 is as follows. Denoted at 15V and 15H are air springs for vertical and horizontal motion driving. Denoted at 16V and 16H are vertical and horizontal vibration sensors, respectively. Denoted at 17V and 17H are vertical and horizontal position sensors, respectively. Denoted at 18V and 18H are vertical and horizontal servo valves. Denoted at 19 is a laminated rubber, and denoted at 20 is a horizontal pre-loading mechanical spring. Denoted at 21 is a casing.

In a conventional feed-forward system, any vibration of a base for mounting a semiconductor exposure apparatus thereon is detected by use of ground-vibration vertical and horizontal vibration sensors 22V and 22H which are disposed below the damper supporting leg 14. Output signals from these sensors are compensated appropriately, and then the vertical and horizontal driving air springs 15V and 15H are actuated, to thereby cancel transmission of vibration of the base to the major structure 12. However, the damper leg 14 is fixed to a palette 23, and there is a leveling block 24 for leveling the major structure 12. In such structural member, a local vibration is inevitably produced. Therefore, any local vibration other than the vibration component of the base structure may be mixed into a detection signal from the vibration sensor 22V or 22H. If the ground vibration feed-forward control is executed on the basis of such detection signal, the vertical and horizontal driving air spring 15V and 15H will be driven in response to a signal, responsive to such local vibration. Thus, the anti-vibration characteristic for the major structure 12 will be deteriorated as compared with a control without ground vibration feed-forward.

In the present invention, the ground vibration feed-forward control based on the outputs of the vibration sensors 22V and 22H is not used. Namely, the vibration sensors 22V and 22H are not provided below the damper supporting leg 14. In place, a genuine vibration in a base of the semiconductor exposure apparatus 1, which is completely free from any local vibration, is detected by use of the three-component vibrograph 7 embedded in the pedestal 2. A detection signal from it is used for the ground vibration feed-forward control.

More specifically, the structure and operation of a control unit 25 will be described, with reference to an example of a control system for vertical direction.

An output of a vertical direction vibration sensor 16V is passed through a filtering circuit 26 having an appropriate filtering time constant, and it is fed back to the front of a voltage-to-current converter 27 which drives a vertical direction servo valve 18V. With this feedback loop, damping is applied to the mechanism. On the other hand, an output signal of a vertical position sensor 17V is applied to a comparator 29. The comparator compares the received output signal with a voltage being applied to a command voltage input terminal 28, for stably positioning the major structure 12 at a predetermined position, whereby an error signal is produced. The thus obtained error signal is applied to a position compensator 30. As the compensator 30, a PI compensator may preferably be used, as an example. Here, "P" means "proportional" and "I" means "integration".

Then, an added signal of the output of the position compensator 30 and the negative feedback signal of the filtering circuit 26, energizes the voltage-to-current converter 27 for driving the servo valve 18V. In response, with the opening or closing motion of the servo valve 18V, the inside pressure of the vertical direction driving air spring 15V is controlled, such that the major structure 12 is stably positioned at a position as specified by the voltage being applied to the command voltage input terminal 28. What is described above is the structure and operation of the feedback system for stably positioning the major structure 12 at a desired position in the vertical direction.

The ground vibration feed-forward function is a feed-forward control just to apply a signal to the feedback system described above. An output of the three-component vibrograph embedded in the pedestal 2 in accordance with the present invention, responsive to vibration in the vertical direction, is applied to a ground vibration feed-forward compensator 31, and an output of the compensator is applied to the front of the voltage-to-current converter 27. With such ground vibration feed-forward control, the influence of vibration of the pedestal 2 upon the semiconductor exposure apparatus 1 can be cancelled.

In FIG. 8, the system structure for the ground vibration feed-forward control is illustrated only with respect to one active mount for supporting the major structure 12. Also, only the structure of ground vibration feed-forward system with respect to the vertical direction is illustrated. Practically, however, there are a plurality of damper supporting legs for supporting the major structure 12, or the damper supporting leg provides its function with respect to plural locations. The ground feed-forward control based on an output of the three-component vibrograph, being embedded in the pedestal, is made in relation to the vertical and horizontal direction of the damper legs, not shown.

Advantageous effects of the provision of a vibration sensor embedded for vibration detection in the pedestal can be summarized as follows.

(1) Conventionally, a vibration sensor for ground vibration feed-forward is mounted on the major structure 12 of the semiconductor exposure apparatus 1. However, choosing and designing a location free from local vibration or mounting the vibration sensor thereat requires a complicated work. As compared therewith, in the present invention, vibration of the pedestal itself which is completely free of local vibration is directly measured. Thus, in accordance with the present invention, vibration of the mounting base which is very influential to the semiconductor exposure apparatus can be detected assuredly and without interfering the assembling, for example, of the semiconductor exposure apparatus.

(2) A vibration sensor is a small heat generation source and, where it is mounted on the major structure 12, a special design should be made against the heat source. In the present invention, the vibration sensor is embedded in the pedestal and, therefore, such special design is unnecessary.

(3) A vibration sensor embedded in the pedestal does not at all detect any local vibration attributable to this sensor mounting. In other words, the sensor can detect genuine vibration of a mounting base which is influential to the performance of the semiconductor exposure apparatus 1. Therefore, with the provision of the ground vibration feed-forward control based on the detection of this vibration, the anti-vibration characteristic can be improved positively.

(4) The vibration sensor embedded in the pedestal can be used as a sensor for emergency stop of the operation of the semiconductor exposure apparatus when an earthquake occurs. Conventionally, the output of a vibration sensor or a displacement sensor mounted in a semiconductor exposure apparatus is monitored. When the output of such sensor increases beyond a predetermined level, the occurrence of an earthquake is detected and, in response, a signal for emergency stop of the exposure apparatus is produced. In other words, it is necessary to provide a vibration sensor or displacement sensor in the semiconductor exposure apparatus, for earthquake detection. This causes a limitation to machine design in relation to the mounting of the sensor, and also it makes the electric wiring complicated. In accordance with the present invention, as compared therewith, an output of the vibration sensor embedded in the pedestal can be used as an earthquake detection signal. Thus, the complicatedness described above can be avoided.

It should be noted here that the pedestal of the present invention is not limited to use in a scanner type semiconductor exposure apparatus. It can be applied also to a stepper type semiconductor exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. A system, comprising:
   a pedestal structure serving as a base for mounting an exposure apparatus thereon;
   a vibration sensor embedded in or incorporated in said pedestal structure; and
   an exposure apparatus mounted on said pedestal.

2. A system according to claim 1, wherein said vibration sensor is operable to detect at least one of an acceleration and a velocity.

3. A system according to claim 1, wherein said vibration sensor is operable to detect vibration in orthogonal three axial directions.

4. A system according to claim 1, further comprising an active anti-vibration system provided in said exposure apparatus.

5. A pedestal according to claim 4, wherein an output of said vibration sensor is used as a feed-forward signal for a ground vibration feed-forward control through said active anti-vibration system.

6. An exposure apparatus, comprising:
   a major structure;
   an active anti-vibration system for supporting said major structure;
   a pedestal on which said major structure is mounted through said active anti-vibration system; and
   a vibration sensor embedded in or incorporated in said pedestal, wherein
   said active anti-vibration system performs its anti-vibration function on the basis of an output of said vibration sensor.

7. An apparatus according to claim 6, wherein an output of said vibration sensor is used as a feed-forward signal for a ground vibration feed-forward control through said active anti-vibration system.

8. An apparatus according to claim 6, further comprising a controller, wherein, when an earthquake is detected by said vibration sensor, said controller controls the operation of said exposure apparatus on the basis of the detection by said vibration sensor.

* * * * *

UNITED STATES PATENT AND TRADEMARK OFFICE
CERTIFICATE OF CORRECTION

PATENT NO.   : 6,477,908 B1
DATED        : November 12, 2002
INVENTOR(S)  : Shinji Wakui It is certified that error appears in the above-identified patent and that said Letters Patent is hereby corrected as shown below:

Title page,
Item [*] Notice:, "32 days" should read -- 0 days --.

Column 5,
Line 4, "is major" should read -- is a major --.

Column 7,
Line 16, "plicatedness" should read -- plications --.

Column 8,
Line 7, "pedestal" should read -- system --.

Signed and Sealed this

Twenty-second Day of July, 2003

JAMES E. ROGAN
*Director of the United States Patent and Trademark Office*